(12) United States Patent
Breidenassel et al.

(10) Patent No.: US 10,290,791 B2
(45) Date of Patent: May 14, 2019

(54) LIGHTING DEVICE

(75) Inventors: Nicole Breidenassel, Bad Abbach (DE); Klaus Eckert, Herbrechtingen (DE); Johannes Hoechtl, Eichstaett (DE); Henrike Streppel, Regensburg (DE)

(73) Assignee: LEDVANCE GMBH, Garching Bei Munich (DE)

( * ) Notice: Subject to any disclaimer, the term of this patent is extended or adjusted under 35 U.S.C. 154(b) by 16 days.

(21) Appl. No.: 13/985,324

(22) PCT Filed: Jan. 26, 2012

(86) PCT No.: PCT/EP2012/051252
§ 371 (c)(1),
(2), (4) Date: Aug. 14, 2013

(87) PCT Pub. No.: WO2012/110292
PCT Pub. Date: Aug. 23, 2012

(65) Prior Publication Data
US 2013/0320365 A1  Dec. 5, 2013

(30) Foreign Application Priority Data
Feb. 14, 2011 (DE) .......................... 10 2011 004 022

(51) Int. Cl.
*F21V 3/02* (2006.01)
*F21K 9/232* (2016.01)
(Continued)

(52) U.S. Cl.
CPC ............ *H01L 33/648* (2013.01); *F21K 9/232* (2016.08); *F21V 3/02* (2013.01); *F21V 17/164* (2013.01);
(Continued)

(58) Field of Classification Search
CPC ..... H01L 31/052; H01L 31/12; H01L 31/143; H01L 31/147; H01L 31/16; H01L 33/00;
(Continued)

(56) References Cited

U.S. PATENT DOCUMENTS 5,586,004 A * 12/1996 Green et al. .................. 361/699
7,513,653 B1 * 4/2009 Liu et al. ...................... 362/294
(Continued)

FOREIGN PATENT DOCUMENTS

DE  202009006095 U1  7/2009
DE  102009008096 A1  8/2010
(Continued)

OTHER PUBLICATIONS

Schweber, "Thermal Considerations for LED-based Luminaires", Digi-key Electronics, Sep. 2014, pp. 1-4.*
Chinese Office Action based on Application No. 2012800068963(10 Pages and 6 Pages of English translation) dated Apr. 16, 2015 (Reference Purpose Only).

*Primary Examiner* — Shaun M Campbell
(74) *Attorney, Agent, or Firm* — Hayes Soloway PC

(57) ABSTRACT

A lighting device includes a heat sink, through which air can flow transversely to its longitudinal extension and a plurality of semiconductor light sources, in particular light-emitting diodes, arranged on the heat sink, wherein at least two of the semiconductor light sources are aligned in different directions.

14 Claims, 10 Drawing Sheets

(51) Int. Cl.

| | |
|---|---|
| *F21V 17/16* | (2006.01) |
| *F21V 29/70* | (2015.01) |
| *F21V 29/74* | (2015.01) |
| *F21V 29/80* | (2015.01) |
| *F21V 29/83* | (2015.01) |
| *H01L 33/64* | (2010.01) |
| *F21V 29/506* | (2015.01) |
| *F21Y 115/10* | (2016.01) |

(52) U.S. Cl.
CPC ............ *F21V 29/506* (2015.01); *F21V 29/70* (2015.01); *F21V 29/74* (2015.01); *F21V 29/80* (2015.01); *F21V 29/83* (2015.01); *F21Y 2115/10* (2016.08)

(58) Field of Classification Search
CPC . H01L 33/08; H01L 21/4803; H01L 21/4871; H01L 21/4882; H01L 23/36; H01L 23/367; H01L 23/3672; H01L 23/3677; H01L 2225/06589; H01L 2225/1094; H01L 33/648; H01L 33/64; H01L 31/167; F21K 9/135; F21V 17/164; F21V 29/22; F21V 29/2206; F21V 29/2275; F21V 29/2293; F21V 3/005; F21V 3/02; F21Y 2101/02
USPC ........... 257/88, 99, 704, 712, 718, 722, 730; 362/218, 294, 362, 373, 547
See application file for complete search history.

(56) References Cited

U.S. PATENT DOCUMENTS

| | | | |
|---|---|---|---|
| 8,021,019 | B2 | 9/2011 | Chen et al. |
| 8,534,875 | B1* | 9/2013 | Zhang ...................... F21K 9/13 |
| | | | 313/46 |
| 2007/0159828 | A1* | 7/2007 | Wang ............................ 362/294 |
| 2009/0116233 | A1 | 5/2009 | Zheng et al. |
| 2009/0175041 | A1 | 7/2009 | Yuen et al. |
| 2009/0195186 | A1* | 8/2009 | Guest et al. .................. 315/294 |
| 2009/0296402 | A1 | 12/2009 | Chang et al. |
| 2010/0314985 | A1* | 12/2010 | Premysler ....................... 313/46 |
| 2011/0089838 | A1* | 4/2011 | Pickard et al. .............. 315/113 |
| 2011/0156584 | A1* | 6/2011 | Kim ......................... F21K 9/00 |
| | | | 315/32 |
| 2012/0014098 | A1 | 1/2012 | Breidenassel et al. |
| 2012/0187818 | A1* | 7/2012 | Chuang ................... F21K 9/135 |
| | | | 313/46 |
| 2012/0218755 | A1* | 8/2012 | Bakk .................... F21V 29/004 |
| | | | 362/235 |
| 2012/0313518 | A1* | 12/2012 | Sun .......................... F21K 9/90 |
| | | | 315/32 |
| 2013/0039035 | A1 | 2/2013 | Harkam et al. |

FOREIGN PATENT DOCUMENTS

| | | |
|---|---|---|
| DE | 102010013538 A1 | 10/2011 |
| EP | 2330345 A2 | 6/2011 |
| WO | 2009091562 A2 | 7/2009 |
| WO | 2010024583 A2 | 3/2010 |

* cited by examiner

LIGHTING DEVICE

RELATED APPLICATIONS

The present application is a national stage entry according to 35 U.S.C. § 371 of PCT application No.: PCT/EP2012/051252 filed on Jan. 26, 2012, which claims priority from German application No.: 10 2011 004 022.6 filed on Feb. 14, 2011.

TECHNICAL FIELD

Various embodiments relate to a lighting device having a heat sink, through which air can flow transversely to its longitudinal extension, and having a plurality of semiconductor light sources arranged on the heat sink, in particular light-emitting diodes.

BACKGROUND

LED retrofit lamps are known, in which light-emitting diodes (LEDs) are arranged on a support region oriented toward the front and only emit their light into a front half space. Cooling ribs extend in the rear direction from the support region.

Furthermore, LED retrofit lamps are known, which achieve a roughly omnidirectional light emission by a use of appropriately shaped optical waveguides.

LED retrofit lamps are also known, which have a cuboid carrier standing vertically on a base (which also accommodates a driver). The carrier is covered by a cover similar to an incandescent lamp. The light-emitting diodes are arranged on all free sides of the carrier and are therefore aligned toward the front (in the direction of a longitudinal axis aligned from back to front) and laterally with a rotational symmetry of 90° around the longitudinal axis. A heat sink around which cooling air can flow does not exist.

SUMMARY

Various embodiments provide a lighting device, in particular a retrofit lamp, of the type mentioned at the beginning, which, using simple means, allows a high cooling action and an optically effective light emission characteristic into a broad spatial angle range, in particular an at least approximately omnidirectional light emission.

The lighting device has a heat sink, through which (cooling) air can flow transversely to its longitudinal extension and a plurality of semiconductor light sources arranged on the heat sink. At least two of the semiconductor light sources are aligned in different directions.

Good cooling and avoidance of overheating are made possible even in the event of a recumbent or horizontal location of the lighting device by way of the heat sink which can have transverse flow. Through the different alignment of the semiconductor light sources (three-dimensional arrangement), a light emission is made possible into a broad spatial angle range even without a complex provision of reflectors.

The fact that at least two of the semiconductor light sources are aligned in different directions can mean in particular that they are arranged on support regions which are not aligned parallel to one another.

The heat sink has in particular at least one cooling structure. The cooling structure can in particular have at least one cooling projection, in particular at least one cooling rib or cooling strut, but also cooling pins, lamellae, or the like.

The at least one semiconductor light source preferably includes at least one light-emitting diode. If a plurality of light-emitting diodes are provided, these may emit light in the same color or in different colors. A color may be monochrome (e.g., red, green, blue, etc.) or multichrome (e.g., white). The light emitted by the at least one light-emitting diode can also be infrared light (IR-LED) or ultraviolet light (UV-LED). A plurality of light-emitting diodes may generate a mixed light; e.g., white mixed light. The at least one light-emitting diode may contain at least one wavelength-converting phosphor (conversion LED). The phosphor may alternatively or additionally be arranged at a distance from the light-emitting diode ("remote phosphor"). The at least one light-emitting diode may be provided in the form of at least one individually housed light-emitting diode or in the form of at least one LED chip. A plurality of LED chips may be installed on a shared substrate ("submount"). The at least one light-emitting diode can be equipped with at least one separate and/or shared optic for beam guiding, e.g., at least one Fresnel lens, collimator, etc. Instead of or in addition to inorganic light-emitting diodes, e.g., based on InGaN or AlInGaP, in general organic LEDs (OLEDs, e.g., polymer OLEDs) are also usable. Alternatively, the at least one semiconductor light source can have, e.g., at least one diode laser.

In one embodiment, the lighting device has a light-transmissive cover for covering the semiconductor light sources and a cooling structure of the heat sink, in particular including a plurality of cooling struts, protrudes into a longitudinal section of the lighting device in which the cover is also located (also referred to hereafter as the "bulb region"). The cooling structure and the cover therefore share the bulb region, whereby heat dissipation of the lighting device in the bulb region is improved.

Alternatively, the heat sink may substantially not protrude into the bulb region, but rather may only be arranged behind the semiconductor light sources, for example. The semiconductor light sources may be arranged, for example, on a three-dimensionally shaped, heat-conductive carrier, so that waste heat of the light-emitting diodes can be transmitted to the heat sink via the substrate (which itself does not have any dedicated cooling structure).

In one embodiment, parts of the cooling structure of the heat sink, in particular cooling struts, and semiconductor light sources are arranged alternately in a circumferential direction of the lighting device. A lighting device which may be substantially uniformly and effectively cooled in the bulb region and which illuminates sufficiently uniformly in the circumferential direction may thus be provided. This embodiment may include, for example, a repeated sequence in the circumferential direction of a cooling strut and at least one semiconductor light source.

In still another embodiment, the heat sink has a front support region for arranging at least one of the semiconductor light sources, a plurality of cooling ribs or cooling struts extend in the rear direction (opposite to the direction of the longitudinal axis) from the upper support region, in particular from its edge, a plurality of laterally aligned or lateral support regions for respectively at least one of the semiconductor light sources project from the upper support region, in particular from its edge, and/or the lateral support regions are arranged between respective cooling struts (or other cooling projections). The upper support regions and the lateral support regions (or the support surfaces thereof which carry the semiconductor light sources) are aligned differently. Direct irradiation of an upper half space extending in the direction of the longitudinal axis is easily made possible by the front support region, for example, by means of a support surface oriented toward the front for at least one of the semiconductor light sources. The cooling struts extending from the front support region cause a large-area, effective heat dissipation from the upper support region. The lateral support regions allow lateral light emission in a simple manner, in particular substantially over a half space extending on both sides up to the longitudinal axis. The lateral support regions can extend in the rear direction, for example. Because the lateral support regions are arranged between respective cooling struts, amplified heat dissipation is also allowed from the lateral support regions, in particular toward the cooling struts, and with light emission which is not substantially obstructed by the cooling struts. The cooling struts, or the like, preferably protrude to the rear beyond the lateral support regions, in order to allow a high level of transverse flow.

Instead of the lateral support regions provided on the heat sink, these can also be provided, for example, on a carrier, in particular one which has good thermal conductivity, which is fastened on the heat sink.

For still further amplified heat dissipation from the lateral support regions to the cooling struts, adjacent lateral support regions and cooling struts are preferably connected to one another, for example, by welding or integrally. The lateral support regions and the cooling struts can thus in particular form a ring.

Furthermore, in one embodiment, the cover overlaps the front support region and the lateral support regions while leaving the cooling struts free. The cover thus does not obstruct the effect of the cooling struts and nonetheless reliably protects the semiconductor light sources.

The cover may then have in particular a plurality of strip-shaped or tab-shaped regions, which each overlap one of the lateral support regions. The lateral support regions and similarly the tab-shaped regions may be regularly distributed in particular in the circumferential direction. The tab-shaped regions preferably run together at a tip of the cover, wherein the tip may be used in particular to cover the front support region.

The cover may be latched onto the heat sink in particular, for example, clipped on. For this purpose, the cover may have catch projections in particular on the tab-shaped regions, e.g., catch lugs, which can engage in a matching catch opening or undercut of the heat sink or which can engage behind the heat sink.

The cover may be transparent or opaque (diffusely scattering).

In an embodiment which has particularly good thermal heat dissipation and is producible simply and cost-effectively, at least the front support region, at least a part of the cooling struts, and the lateral support regions are integrally connected to one another or form an integral part.

In a preferred embodiment for particularly simple production, the heat sink is implemented in two parts. In particular, the first part may include the front support region, the cooling struts, and the lateral support regions. The second part may include further cooling struts, for example.

In particular if the heat sink is constructed in two parts, the inner cooling struts and the outer cooling struts may be arranged on different parts.

The heat sink can in general have different types of cooling struts, in particular outer cooling struts and inner cooling struts, wherein the outer cooling struts are arranged further to the outside in the radial direction than the inner cooling struts. The inner cooling struts and/or the outer cooling struts can be arranged rotationally-symmetrically around the longitudinal axis. The inner cooling struts and/or the outer cooling struts may also be distributed uniformly in the circumferential direction.

The heat sink may in particular have at least one sheet-metal part, in particular a stamped/bent part. Alternatively, the heat sink may have at least one cast part, in particular a diecast part, in particular an aluminum diecast part.

In still another embodiment, the lighting device has a light-transmissive cover for covering the semiconductor light sources and has, in a longitudinal section of the lighting device in which the cover is also located, at least one air passage, wherein the at least one air passage allows an air flow through the lighting device in the longitudinal section substantially parallel to the longitudinal extension of the lighting device. An amplified heat dissipation in the bulb region can thus be achieved. Furthermore, a stronger air flow through the heat sink and therefore more effective cooling can be achieved in the event of a vertical or upright location of the lighting device, for example, in that an accumulation of air at a front region of the heat sink is prevented.

The air passages may be implemented in particular as air passage channels. The at least one air passage may extend through the cover, for example, in that the cover provides a corresponding (e.g., funnel-shaped or tubular) channel or channel section. Alternatively or additionally, the cover may be omitted around the air passage. The air passage may in particular include an air passage opening in the heat sink.

Furthermore, in one embodiment, a housing part or housing region, which has a driver cavity provided for receiving a driver, is arranged outside the bulb space, i.e., below the region covered or enclosed by the cover. A reduced heat dissipation from the semiconductor light sources because of waste heat generated by the driver is thus avoided.

In an alternative embodiment, a housing region having a driver cavity is arranged at least partially inside the bulb space, i.e., in the region covered or enclosed by the cover. A particularly short lighting device may thus be provided. For effective heat dissipation of the driver operating in the cavity, in particular by an air stream flowing past it, it is preferable if a greater fraction of the waste heat generated by the driver is generated at the housing part arranged inside the bulb space.

So as not to worsen heat dissipation from the light-emitting diodes because of the waste heat of the driver, in one embodiment, a thermally insulating layer is provided between the driver housing and the heat sink. The thermally insulating layer can be, for example, a layer made of a material having poor thermal conductivity, for example, plastic, or also may be an air gap.

In a refinement, the lighting device is a lamp. In particular, the lamp may be a retrofit lamp, in particular an incandescent lamp retrofit lamp. Retrofit lamps are provided for the purpose of replacing conventional lamps, for example, incandescent lamps. The lighting device has the same electrical terminal for this purpose as the incandescent lamp to be replaced and has an at least coarsely approximated external contour, which in particular does not exceed or does not substantially exceed an external contour of the conventional incandescent lamp.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
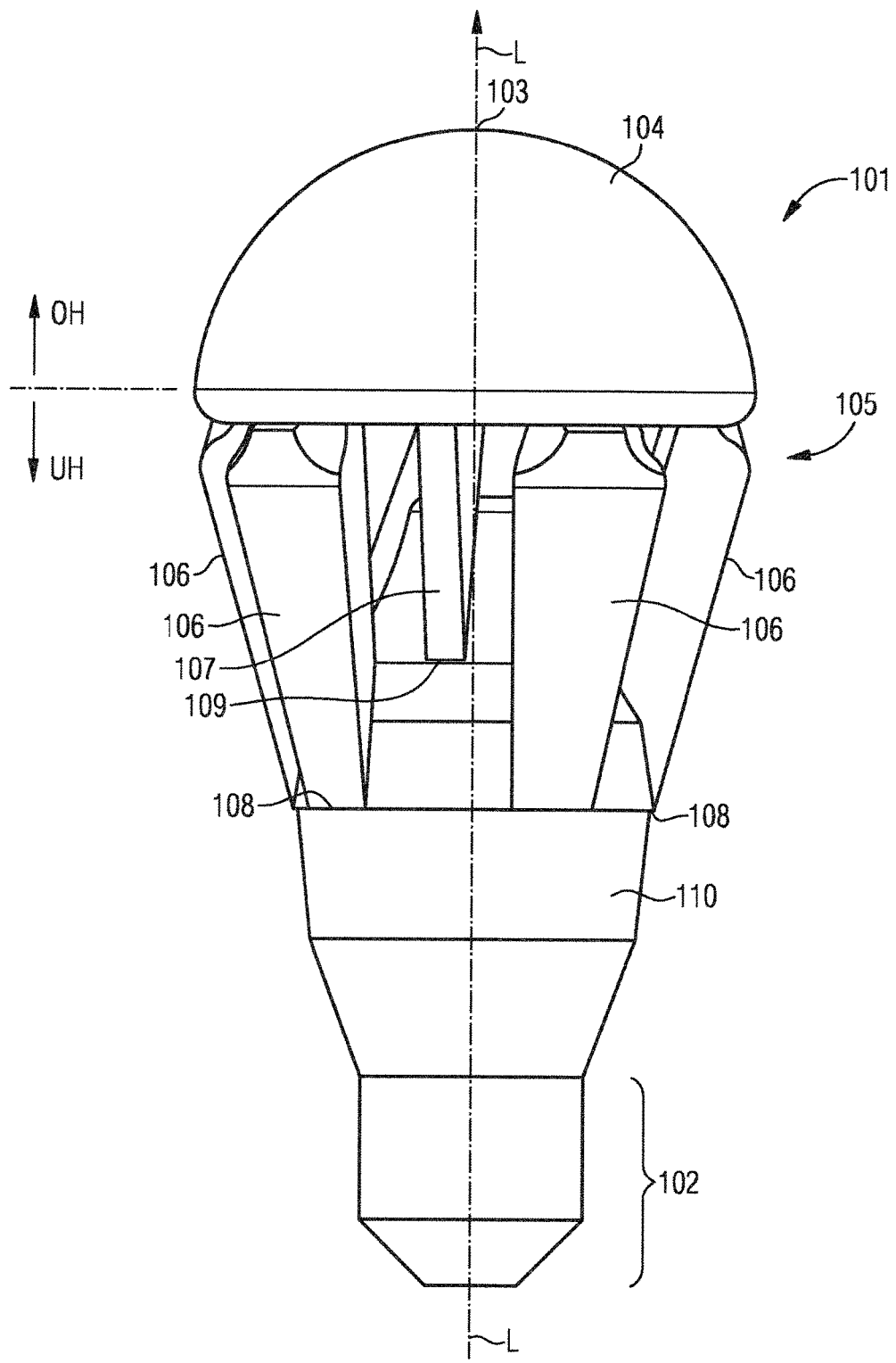
FIG. 1 shows a side view of a lighting device according to a first embodiment.

FIG. 1 shows a side view of a lighting device 101 according to a first embodiment. The lighting device 101 is an LED incandescent lamp retrofit lamp, i.e., it uses light-emitting diodes as semiconductor light sources and is provided for the purpose of replacing a conventional incandescent lamp. The lighting device 101 has the same electrical terminal for this purpose as the incandescent lamp to be replaced and has an at least coarsely approximated external contour, which in particular does not exceed or does not substantially exceed an external contour of the conventional incandescent lamp.

The lighting device 101 is elongated substantially along its longitudinal axis L. The lighting device 101 is substantially rotationally-symmetrical to the longitudinal axis L. A rear end of the lighting device 101 is formed by a base 102, which forms the electrical terminal, for example, an Edison screw-type base. A front end of the lighting device 101 is formed by a tip 103 of a light-transmissive cover 104. The light-transmissive cover 104 has a shape of a spherical cap and covers a plurality of light-emitting diodes (not illustrated). At least two of the light-emitting diodes are aligned in different directions (three-dimensional arrangement), i.e., they have different main emission directions. A greater spatial angle can thus be irradiated in comparison to an alignment of the light-emitting diodes performed only in parallel to the longitudinal axis L. Since light-emitting diodes typically only emit into a half space centered around their main emission direction, in the event of an alignment of the light-emitting diodes or their main emission direction only in the direction of the longitudinal axis L ("planar arrangement"), only an upper half space OH above their light exit surfaces (direct and therefore particularly optically effective) is also irradiated. By way of the different alignments of the light-emitting diodes, light can be irradiated in a simple manner also directly into a lower half space UH complementary to the upper half space OH.

The light-emitting diodes are arranged, for example, on a front region (not illustrated) of a heat sink 105, which is covered here by the cover 104. The heat sink 105 is constructed in two parts, as described in greater detail hereafter with reference to FIGS. 6 to 9.

Five outer cooling struts 106 extend in the rear direction from the front region of the heat sink 105. The outer cooling struts 106 are arranged in a circumferential direction uniformly spaced apart at an angular offset of approximately 72°. Adjacent outer cooling struts 106 have a large air gap between them. Furthermore, inner cooling struts 107 extend in the rear direction from the front region, which are arranged rotationally-symmetrically in a circumferential direction. A large air gap is located between at least some of the inner cooling struts 107. The inner cooling struts 107 are shorter than the outer cooling struts 106.

The cooling struts 106 and 107 are seated with their respective rear end 108 or 109, respectively, on a housing region 110 or are attached with their rear ends 108, 109 close to the housing region 110. The housing region 110 adjoins the base 102 at the rear and carries the heat sink 105 on the front side. The housing region 110 is also used for receiving a driver for operating the light-emitting diodes from an electrical signal tapped via the base 102 and contains a driver cavity for this purpose (not illustrated).

During operation of the lighting device 101, the light-emitting diodes heat up and dissipate their waste heat to the heat sink 105. A space which is covered by the cover 104 is also heated, from which heat is partially dissipated via the cover 104. In addition, the driver housed in the housing region 110 also heats up, and dissipates its waste heat to the housing region 110. If the cooling struts 106 and 107 contact the housing region 110 with their free ends, the housing region 110 can at least partially transmit its heat directly to the cooling struts 106 and 107.

In the case of an upright or vertical alignment of the lighting device 101, the cooling struts 106 and 107 have an air stream, which is likewise aligned substantially vertically (flowing along the longitudinal extension), flowing around them and are thus cooled. In the case of a recumbent or horizontal alignment of the lighting device 101, air can also simply flow through the cooling struts 106 and 107 of the heat sink 105 (transversely to the longitudinal extension), so that good heat dissipation of the heat sink 105 is also possible in this location.

Figure 2:
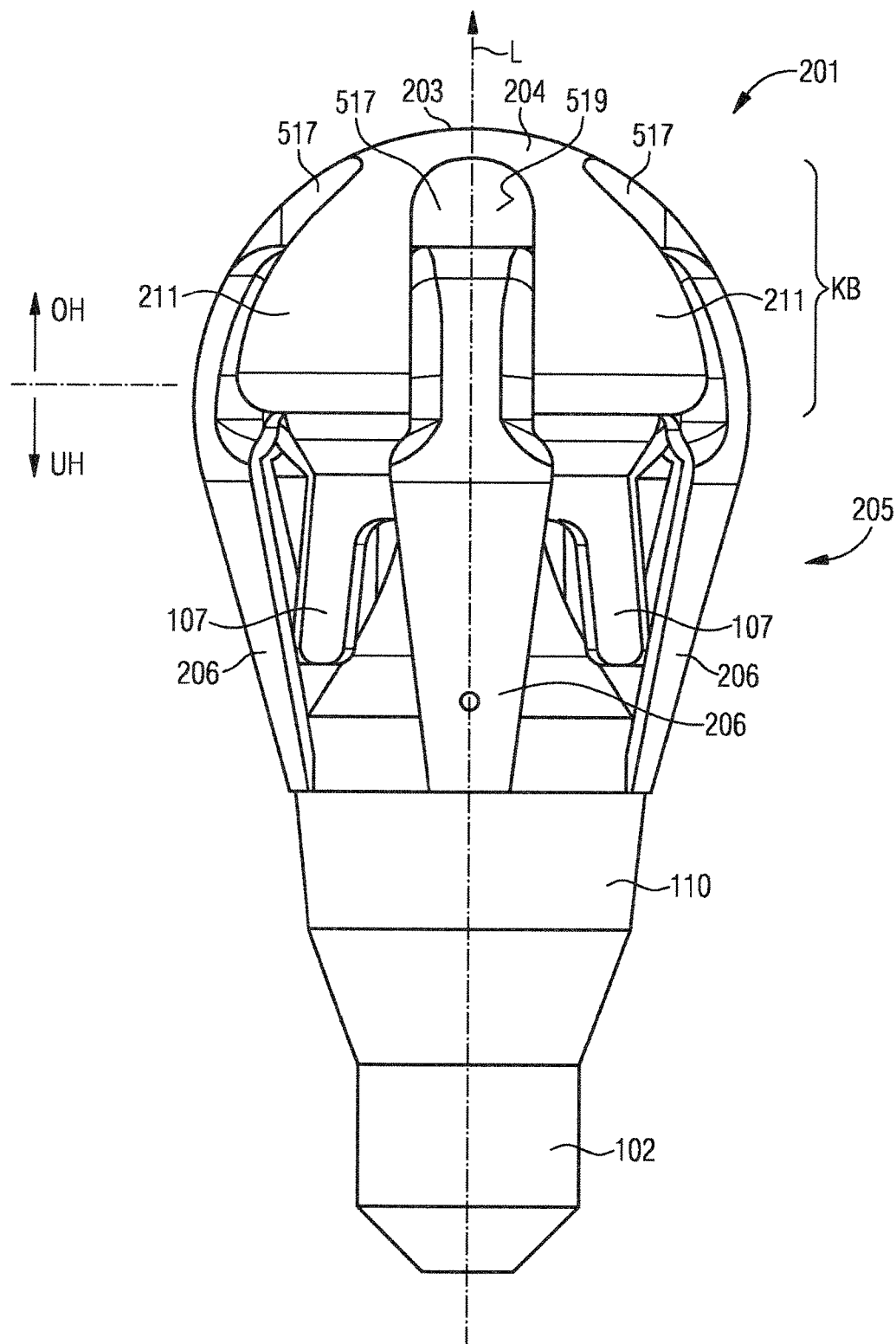
FIG. 2 shows a second side view of the lighting device according to the second embodiment.

FIG. 2 shows a side view of a lighting device 201 according to a second embodiment.

In contrast to the lighting device 201, the other cooling struts 206 now extend in relation to the longitudinal axis L up to a section, also designated hereafter as the bulb region KB, in which the cover 204 is also located. In other words, both parts of the outer cooling struts 206 and also the parts of the cover 204 are located in the bulb region KB. This improves heat dissipation of the lighting device 201, in particular also in the upper half space OH.

More precisely, the cover 204 has a plurality of strip-shaped or tab-shaped regions 211, which are distributed uniformly in the circumferential direction. The tab-shaped regions 211 run together at a tip 203 of the cover 204. The tab-shaped regions 211 and the outer cooling struts 206 alternate in the bulb region KB in the circumferential direction.

Figure 3:
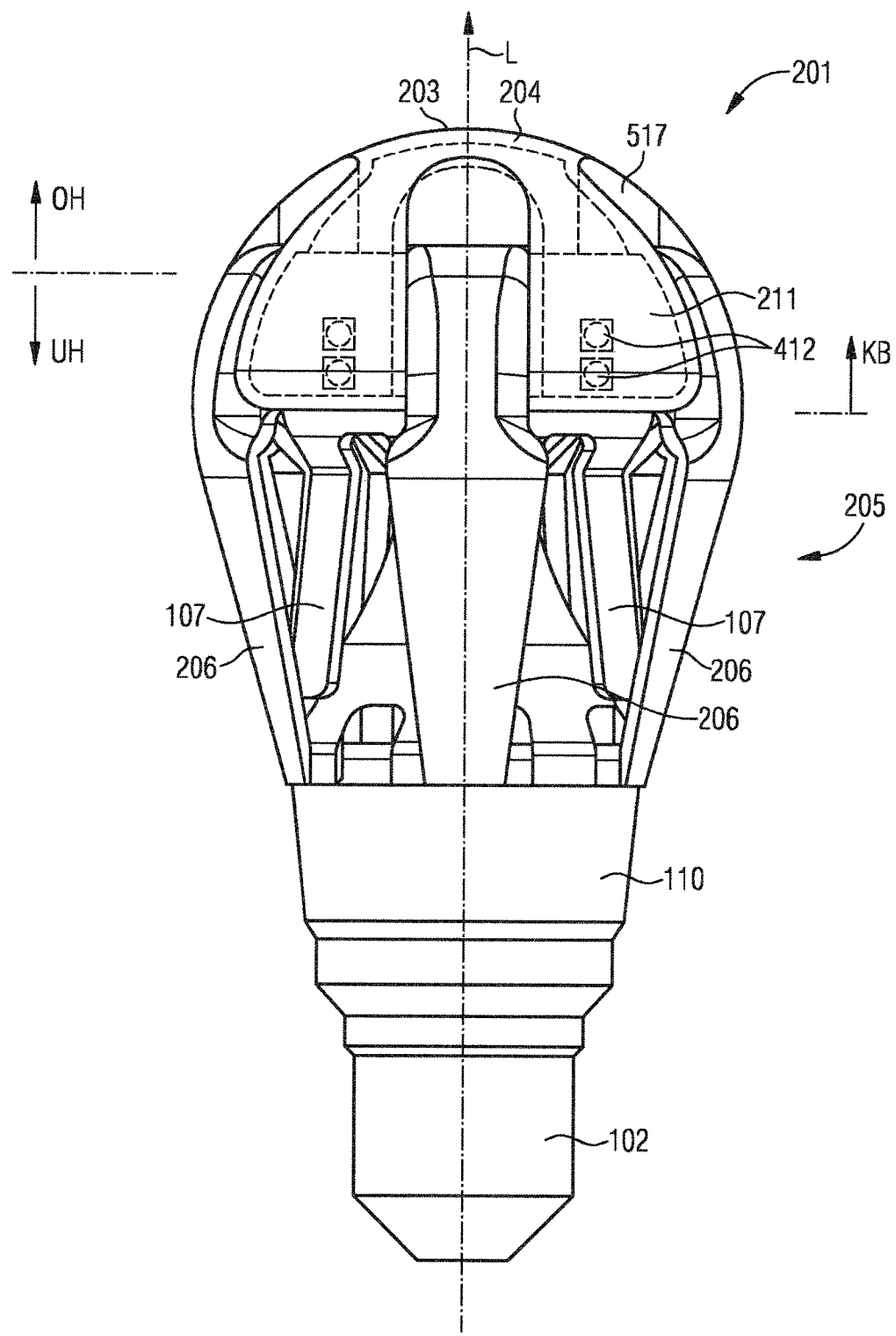
FIG. 3 shows a second side view of the lighting device according to the second embodiment in a higher level of detail.

In particular, the tab-shaped regions 211 may overlap laterally or radially aligned light-emitting diodes 412, as shown in greater detail in FIG. 3.

Each of the tab-shaped regions 211 overlaps two light-emitting diodes 412, which are aligned radially in relation to the longitudinal axis L and are shown as semitransparent here. The light-emitting diodes 412 are not substantially shaded by the cooling struts 206, so that a broad emission results with respect to a circumferential direction. Since the light-emitting diodes 412 are additionally arranged above the gap between the outer cooling struts 206, a broad azimuthal emission with respect to the longitudinal axis L without substantial shading by the cooling struts 206 is also made possible, i.e., broadly into the lower half space UH. This allows an omnidirectional light emission.

Figure 4:
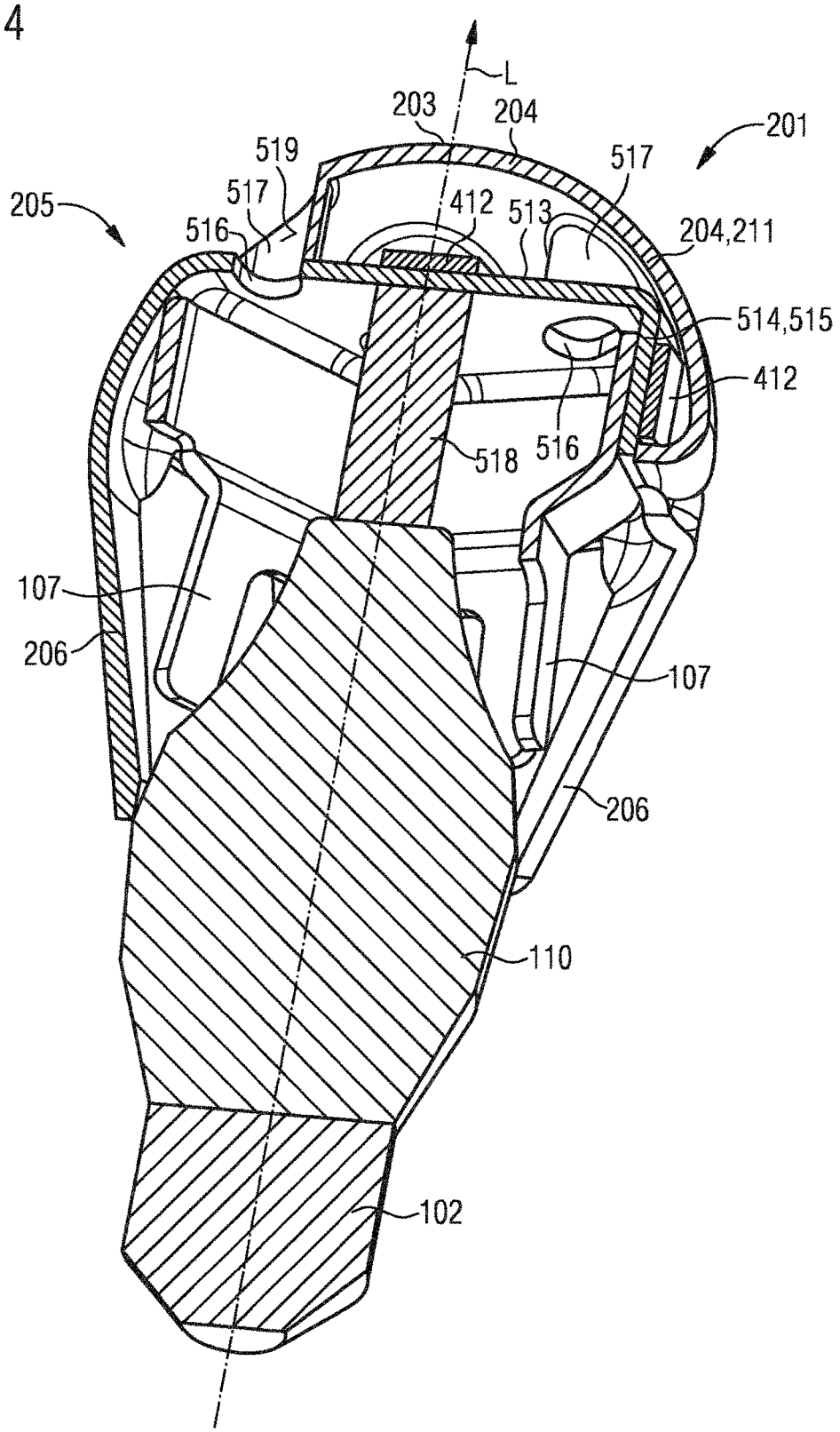
FIG. 4 shows a sectional illustration in a diagonal view of the lighting device according to the second embodiment.
Figure 5:
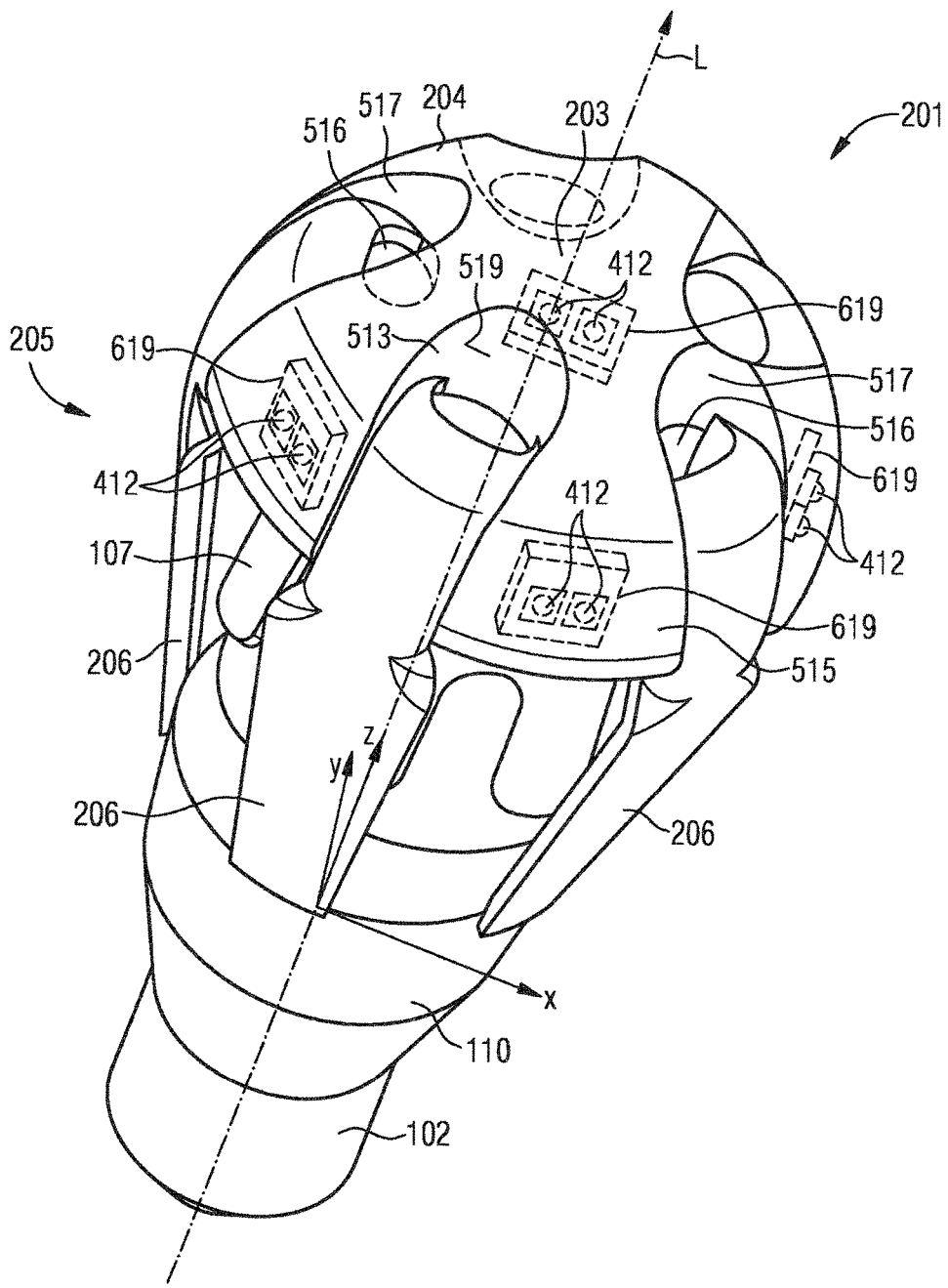
FIG. 5 shows a view diagonally from the front of the lighting device according to the second embodiment.

FIG. 4 shows the lighting device 201 as a sectional illustration in a diagonal view. FIG. 5 shows the lighting device 201 in a view diagonally from the front. The heat sink 205 has a flat front support region 513, which is perpendicular to the longitudinal axis L and has at least one light-emitting diode 412 aligned toward the front (i.e., in the direction of the longitudinal axis L) on its outer side in the middle. The front support region 513 merges at its edge into an edge region 514 angled perpendicularly thereto to the rear. The edge region 514 is composed of the sections of the outer cooling struts 206 present in the bulb region KB and of lateral support regions 515 arranged in between them. The edge of the front support region 513 and the edge region 514 have a pentagonal shape in a top view, so that adjacent outer cooling struts 206 or adjacent lateral support regions 515 are arranged offset at an angle of approximately 72° about the longitudinal axis L. The light-emitting diodes 412 of adjacent lateral support regions 515 thus also emit laterally offset at an angle of approximately 72° about the longitudinal axis L. By way of the different (three-dimensional) alignment (parallel or perpendicular to the longitudinal axis L, respectively) of the support region 513 and the edge regions 514, a great spatial angle range is irradiated and an at least coarsely approximately isotropic light emission similar to a conventional incandescent lamp is made possible.

The front support region 513, the lateral support regions 515, and the outer cooling struts 206 are embodied integrally. The edge region 514 is closed, so that good thermal connection of the lateral support regions 515 to the outer cooling struts 206 results.

A plurality of air passage holes 516, to each of which an opening 517 in the cover 204 is assigned on the outside, are located in the front support region 513. In particular, air located in front of the lighting device 201 can directly reach inside the heat sink 205 through the air passage holes 516, specifically inside an inner region there enclosed by the cooling struts 107, 206, or vice versa. This improves in particular an air stream at the cooling struts 107, 206 (by reducing an air accumulation at the front support region 513) and at the cover 204 in the event of a vertical (upright or inverted) location of the lighting device 201 and improves its cooling. The openings have side walls 519, which obstruct a cooling air stream to the light-emitting diodes 412 and direct mechanical contact and therefore the soiling thereof or mechanical damage thereto.

Furthermore, the housing region 110 is connected to the upper support region 513 via a cable channel 518, in order to be able to lead at least one electrical line originating from the driver (not illustrated) to the light-emitting diodes 412.

As shown in particular in FIG. 5, two light-emitting diodes 412 are installed in each case on a shared substrate 619, and the substrate 619 is fastened on the associated front support region 513 or lateral support region 515.

Figure 6:
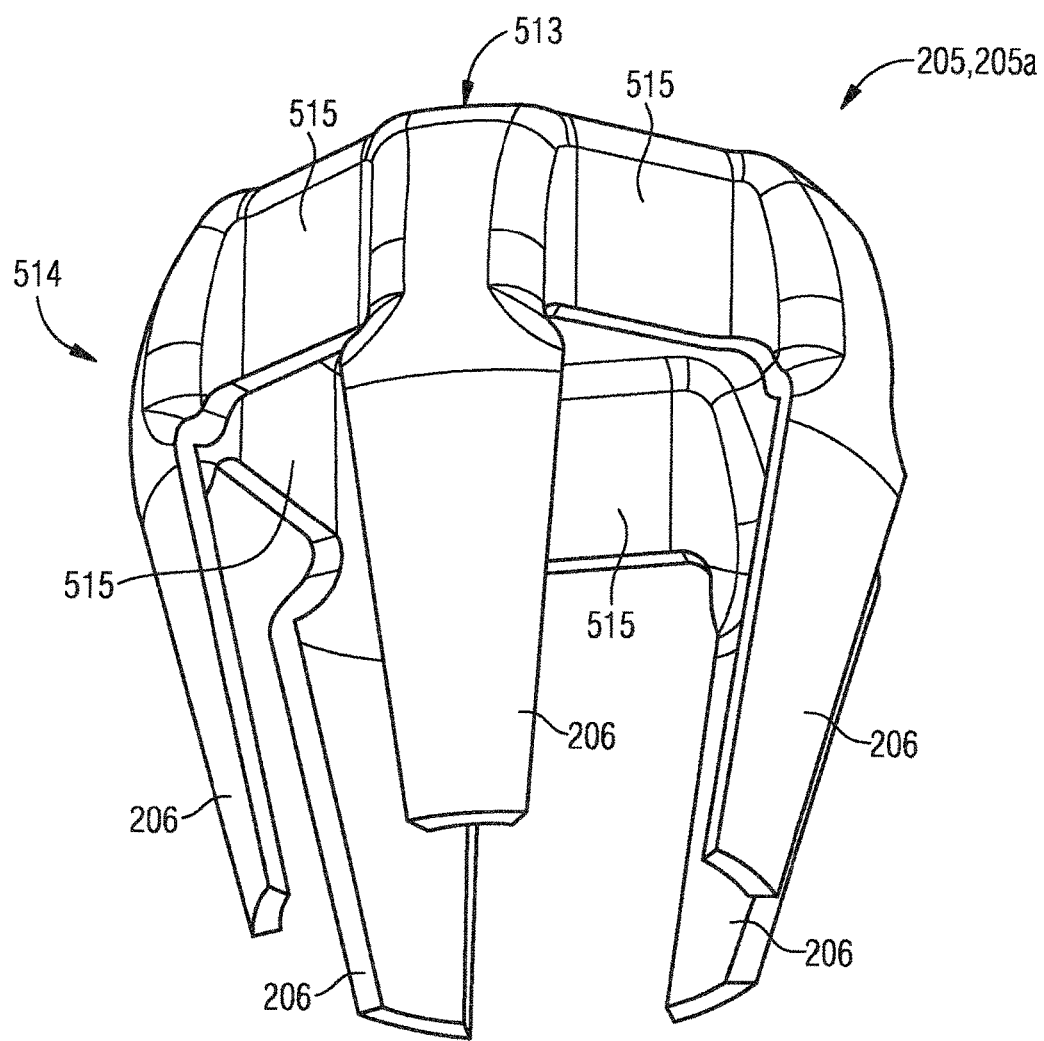
FIG. 6 shows a first part of a two-part heat sink of the lighting device according to the second embodiment.

FIG. 6 shows a first (integral) part 205a of the two-part heat sink 205. The first part 205a consists of the front support region 513, the lateral support regions 515, and the outer cooling struts 206. The lateral support regions 515 and the sections of the outer cooling struts 206 connected thereto form the closed circumferential edge or edge region 514. The front support region 513 and the edge region 514 are thus embodied in a cup or shell shape having a pentagonal basic shape. The outer cooling struts 206 are rounded at their transition to the adjacent lateral support regions 515, in order to provide a sufficiently tight support for the cover 204. The sections of the outer cooling struts 206 originating from the edge region 514 are inclined inward (in the direction of the longitudinal axis L).

The first part 205a may be in particular a sheet-metal part, which is in particular stamped out of a piece of sheet metal and then bent into shape, i.e., a stamped/bent part.

Figure 7:
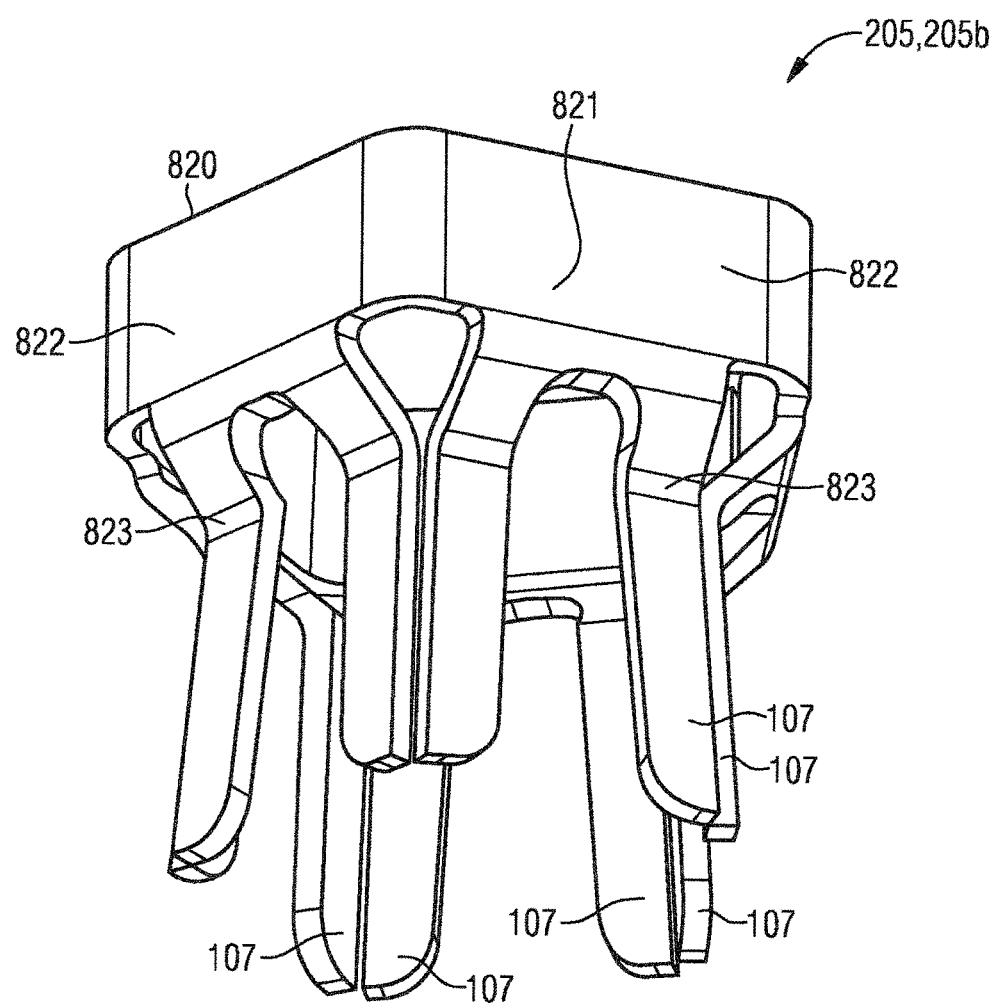
FIG. 7 shows a second part of the heat sink of the lighting device according to the second embodiment.

FIG. 7 shows an (integral) second part 205b of the heat sink 105. The second part 205b has a peripheral edge 820 having a pentagonal footprint (in a top view), which fits into the edge region 514 of the first part without play or with only slight play. The edge 820 is open on both sides (to the front and to the rear), so that the cable channel 518 can be led through. The (inner) cooling struts 107 extend from a lower side 821 of the edge 820, wherein two at least approximately parallel inner cooling struts 107 respectively extend from each of the five lateral surfaces 822. Adjacent inner cooling struts 107 of adjacent lateral surfaces 822 abut one another. For this purpose, the inner cooling struts 107 are bent inward close to the edge 820 and then oriented pointing outward again at a predetermined bending line 823 (with increasing distance from the edge 820).

The second part 205b can also be in particular a sheet-metal part, which is in particular stamped out of a piece of sheet metal and then bent into shape, i.e., a stamped/bent part.

Figure 8:
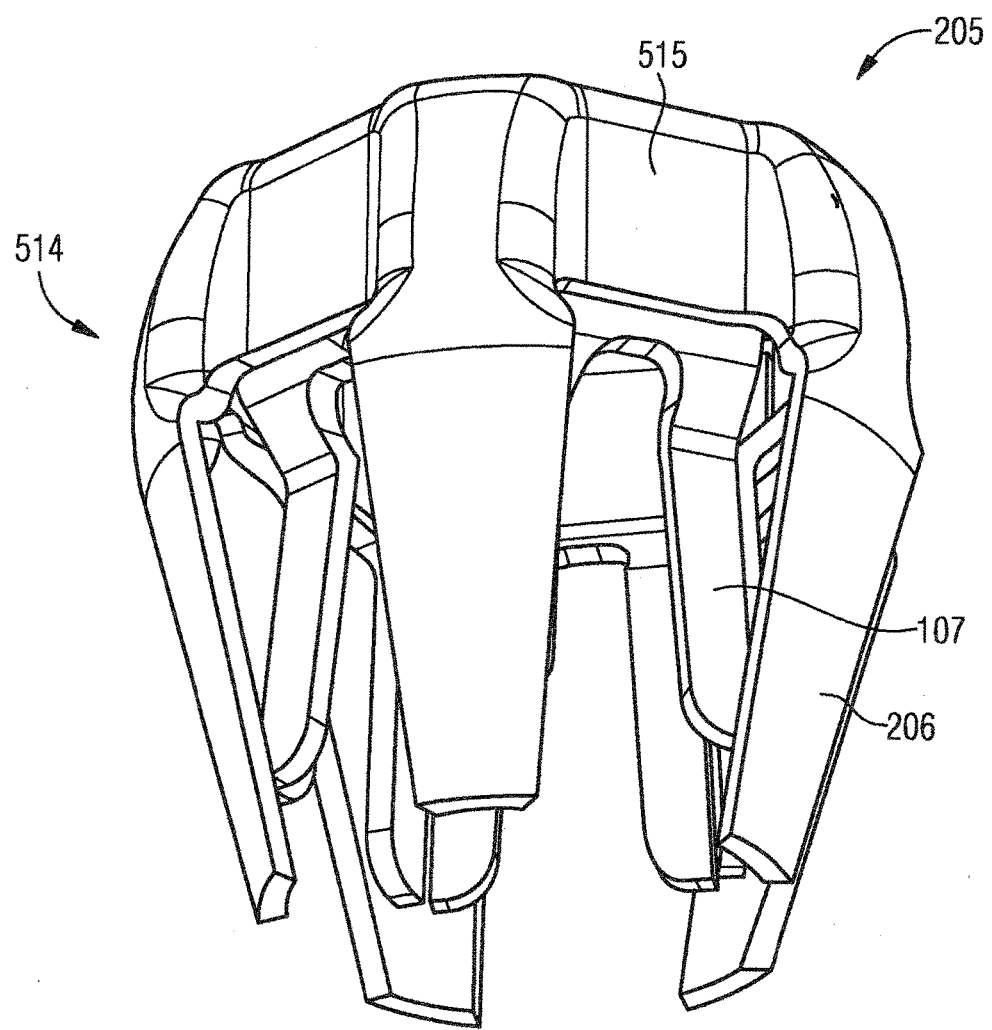
FIG. 8 shows the heat sink, which is composed of the first part and the second part, of the lighting device according to the second embodiment.

FIG. 8 shows the heat sink 205, which is composed of the first part 205a and the second part 205b. For this purpose, the second part 205b has been plugged with its edge 820 in front from the rear into the first part 205a, in particular up to the stop, for example, with elastic bending of the outer cooling struts 206. The two parts 205a and 205b can be connected to one another, for example, by a press fit and/or gluing. The two parts 205a, 205b can also be latched with one another, for which purpose they can have suitable catch elements (not illustrated).

The cover 204 may be latched on the heat sink 205, e.g., by providing inwardly directed catch projections, in the form here of catch lugs, on the free ends of the tab-shaped regions 211, wherein the catch lugs can engage behind a lower edge of the associated lateral support regions 515. The cover 204 can thus be snapped or clipped onto the heat sink 205, for example.

Figure 9:
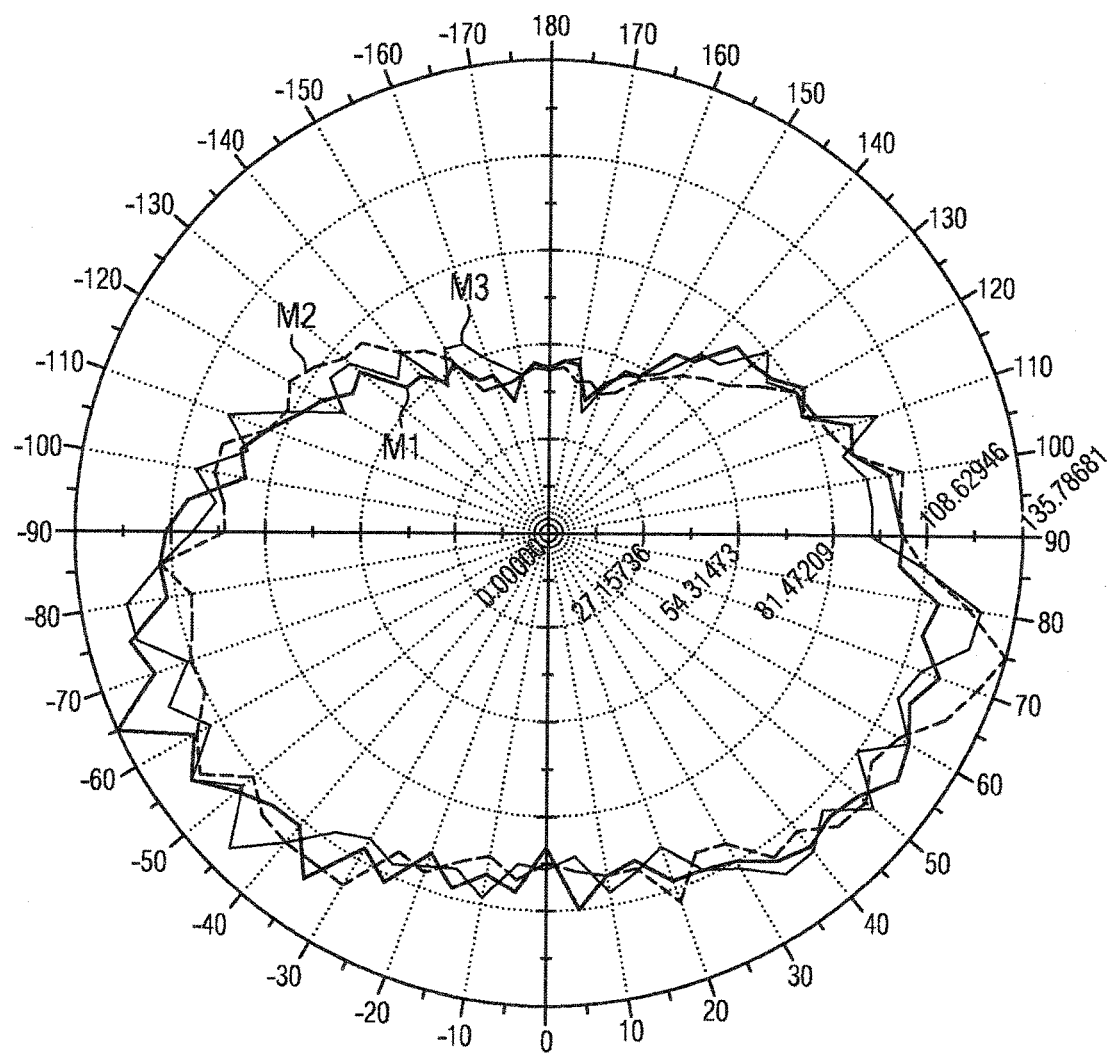
FIG. 9 shows a polar diagram of an intensity of a light emission.

FIG. 9 shows a polar diagram of three measurements M1, M2, M3 of an intensity of a light emission of the lighting device 201, wherein the polar angle is determined with respect to the longitudinal axis L and a polar angle of 0° corresponds to a view against the direction of the longitudinal axis L onto the lighting device 201 or a position of an observer from the lighting device 201 in the direction of the longitudinal axis L. This approximately isotropic light emission achieves an optical pattern which is at least coarsely similar to that of a conventional incandescent lamp and can be described as omnidirectional.

Figure 10:
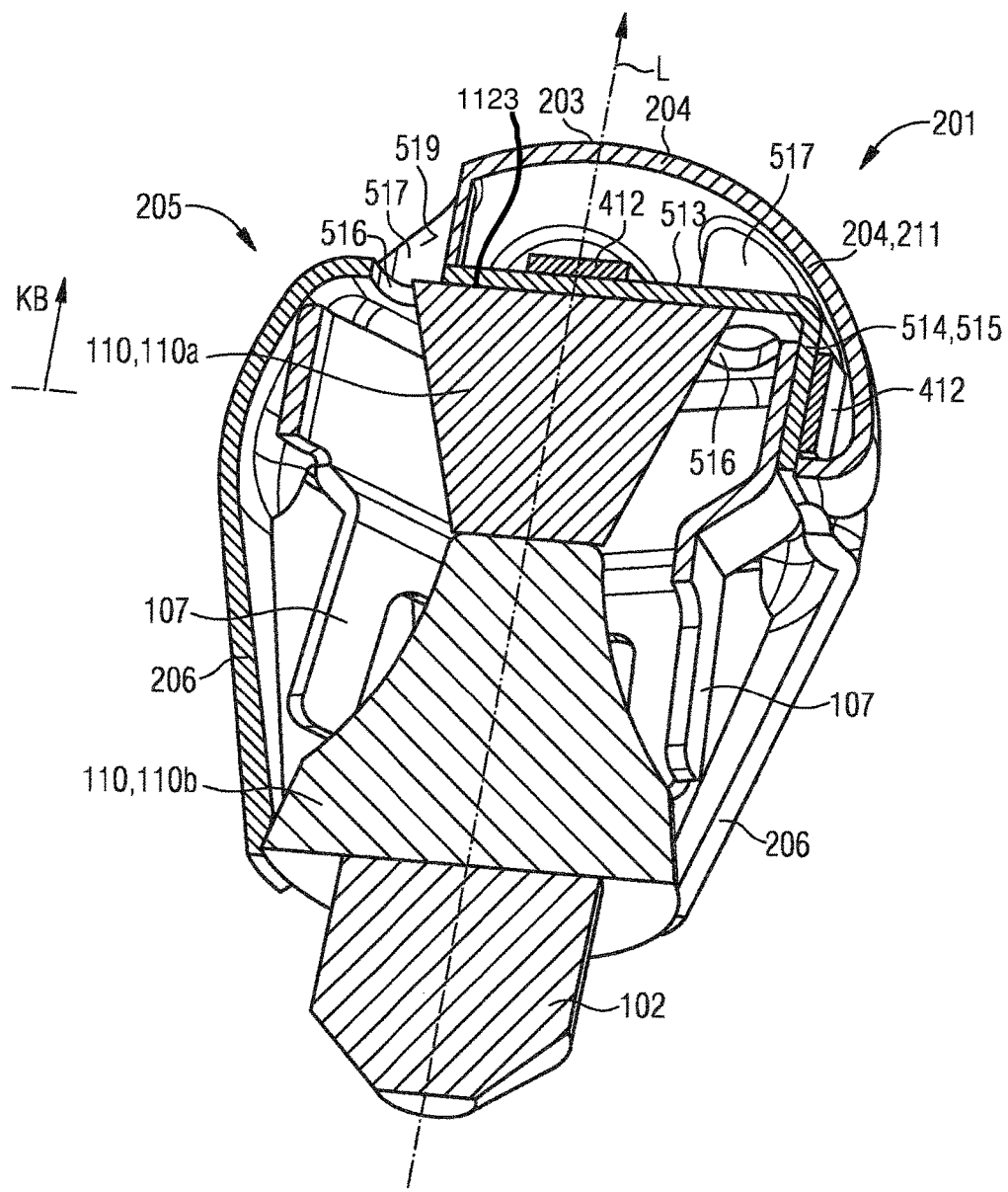
FIG. 10 shows a sectional illustration in a diagonal view of a lighting device according to a third embodiment.

FIG. 10 shows a sectional illustration in a diagonal view of a lighting device 1101 according to a third embodiment.

The lighting device 1101 is implemented similarly to the lighting device 201, except that now the housing region 110 protrudes up to the bulb region KB and the cable channel 518 is no longer provided for this purpose. The housing region 110 is divided into a first housing part 110 a and a second housing part 110 b. The housing parts 110 a and 110 b may form two subregions of a shared driver cavity or may include different driver cavities. In particular, the housing part 110 a protruding into the bulb region KB may accommodate at least a part of the driver, which generates in particular more waste heat than the part of the driver which is housed in the housing part 110b.

A thermally insulating layer 1123 is introduced between the first housing part 110 a and the front support region 513 of the heat sink 205.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCE SIGNS 101 lighting device
102 base
103 tip of the cover
104 light-transmissive cover
105 heat sink
106 outer cooling strut
107 inner cooling strut
108 rear end of the outer cooling strut
109 rear end of the inner cooling strut
110 housing region
201 lighting device
203 tip of the cover
204 cover
205 heat sink
205a first part of the heat sink
205b second part of the heat sink
206 outer cooling strut
211 tab-shaped region of the cover
412 light-emitting diode
513 front support region
514 edge region
515 lateral support region
516 air passage hole
517 opening of the cover
518 cable channel
519 side wall of the opening
619 substrate
820 edge of the second part of the heat sink
821 lower side of the edge of the second part
822 lateral surface of the edge of the second part
823 bending line
1101 lighting device
1110 housing region
1110a first part of the housing region
1110b second part of the housing region
1123 thermally insulating layer
KB bulb region
L longitudinal axis
M1-M3 measurements
OH upper half space
UH lower half space

The invention claimed is:

1. A lighting device having a longitudinal extension, the lighting device comprising:
a rear,
a heat sink, through which air flows at least transversely to the longitudinal extension, and
a plurality of semiconductor light sources arranged on the heat sink,
wherein at least two of the semiconductor light sources are aligned in different directions, further comprising a light-transmissive cover for covering the semiconductor light sources and a cooling structure of the heat sink, the cooling structure of the heat sink having outer cooling struts and inner cooling struts, wherein the outer cooling struts are arranged further to the outside in a radial direction than the inner cooling struts, wherein the outer cooling struts and the inner cooling struts protrude into a longitudinal section in which the cover is also located and extend to the rear, wherein air gaps are present between the outer cooling struts and air gaps are present between the inner cooling struts,
wherein parts of the cooling struts of the heat sink and semiconductor light sources are arranged alternately in a circumferential direction,
wherein the heat sink has a front support region for arranging at least one of the semiconductor light sources, wherein the heat sink further comprises a plurality of lateral support regions for respectively at least one of the semiconductor light sources, wherein the front support region and the lateral support regions are aligned differently and wherein the lateral support regions are arranged between respective outer cooling struts,
wherein the lateral support regions and the outer cooling struts are connected to form a closed circumferential edge and wherein the outer cooling struts originating from the closed circumferential edge are inclined inward, and
where the front support region includes a plurality of air passage holes.

2. The lighting device as claimed in claim 1, wherein adjacent lateral support regions and cooling struts are connected to one another.

3. The lighting device as claimed in claim 1, wherein the cover overlaps the front support region and the lateral support regions while leaving the cooling struts free.

4. The lighting device as claimed in claim 1, wherein the cover has a plurality of tab-shaped regions, which each overlap one of the lateral support regions and which run together at a tip of the cover.

5. The lighting device as claimed in claim 1, wherein at least the front support region, at least a part of the cooling struts, and the lateral support regions are integrally connected to one another or form an integral part.

6. The lighting device as claimed in claim 5, wherein the heat sink comprises two parts.

7. The lighting device as claimed in claim 1, wherein the cover is configured to be latched onto the heat sink.

8. The lighting device as claimed in claim 1, further comprising: in a longitudinal section, in which the light-transmissive cover is located, at least one air passage, which allows an air flow therethrough in the longitudinal section substantially parallel to the longitudinal extension.

9. The lighting device as claimed in claim 1, wherein the lighting device is configured as a retrofit lamp.

10. The lighting device as claimed in claim 1, wherein the semiconductor light sources are light-emitting diodes.

11. The lighting device as claimed in claim 1, wherein the lighting device is configured as an incandescent lamp retrofit lamp.

12. The lighting device of claim 1, wherein the closed circumferential edge and the front support region form a pentagonal basic shape.

13. The lighting device of claim 1, wherein the heat sink includes a peripheral edge and the inner cooling struts extend from a lower side of the peripheral edge.

14. The lighting device of claim 13, wherein the inner cooling struts are bent inward at the peripheral edge and oriented pointing outward with increasing distance from the peripheral edge.

\* \* \* \* \*